United States Patent [19]

Sugano et al.

[11] Patent Number: 4,790,903
[45] Date of Patent: Dec. 13, 1988

[54] INTERMITTENT ETCHING PROCESS

[75] Inventors: Takuo Sugano; Hideharu Miyake, both of Tokyo, Japan

[73] Assignee: University of Tokyo, Tokyo, Japan

[21] Appl. No.: 180,641

[22] Filed: Mar. 18, 1988

Related U.S. Application Data

[63] Continuation of Ser. No. 17,397, Feb. 24, 1987, abandoned.

[30] Foreign Application Priority Data

Apr. 28, 1986 [JP] Japan ................................. 61-97002

[51] Int. Cl.$^4$ ........................................ H01L 21/312
[52] U.S. Cl. .................... 156/643; 156/646; 156/652; 156/653; 156/656; 156/657; 156/661.1; 156/659.1; 156/664
[58] Field of Search .............. 156/659.1, 664, 643, 156/646, 652, 653, 656, 657, 661.1, 668

[56] References Cited

U.S. PATENT DOCUMENTS 4,333,814  6/1982  Küyel .................................. 156/643
4,417,948 11/1983  Mayne-Banton et al. ........... 156/643
4,587,184  5/1986  Schneider-Gmelch et al. .................................... 156/659.1

OTHER PUBLICATIONS

Tennant et al., "Twenty-Five nm . . . Trilevel C-Beam Resist" J. Vac. Sci Tech. 19(4), pp. 1304-1307 (1981).
Kruger et al., "Silicon Transfer Layer for Multilayer Resist Systems" J. Vac. Sci. Tech. 19(4), pp. 1320-1324 (1981).
Itakura, Hideaki, Japanese Patent Abstract 61-8925 Grp. No. E408, vol. 10, No. 150, May 31, 1986.

Primary Examiner—David L. Lacey
Assistant Examiner—Lori-Ann Johnson

[57] ABSTRACT

An intermittent etching process for forming efficiently by reactive ion etching (RIE), a minute recess, such as a groove having an opening width as small as about 0.1 μm, with a large aspect ratio in layers of metals, semiconductors, etc. The process comprises alternating RIE steps of brief duration e.g. 30 seconds with vacuumizing for evacuating gaseous reaction products produced in the RIE step from the etched recess. The process is particularly suitable for formation of a bridging portion of Nb, etc. constituting Josephson devices, by making use of three layered resist technique.

6 Claims, 5 Drawing Sheets

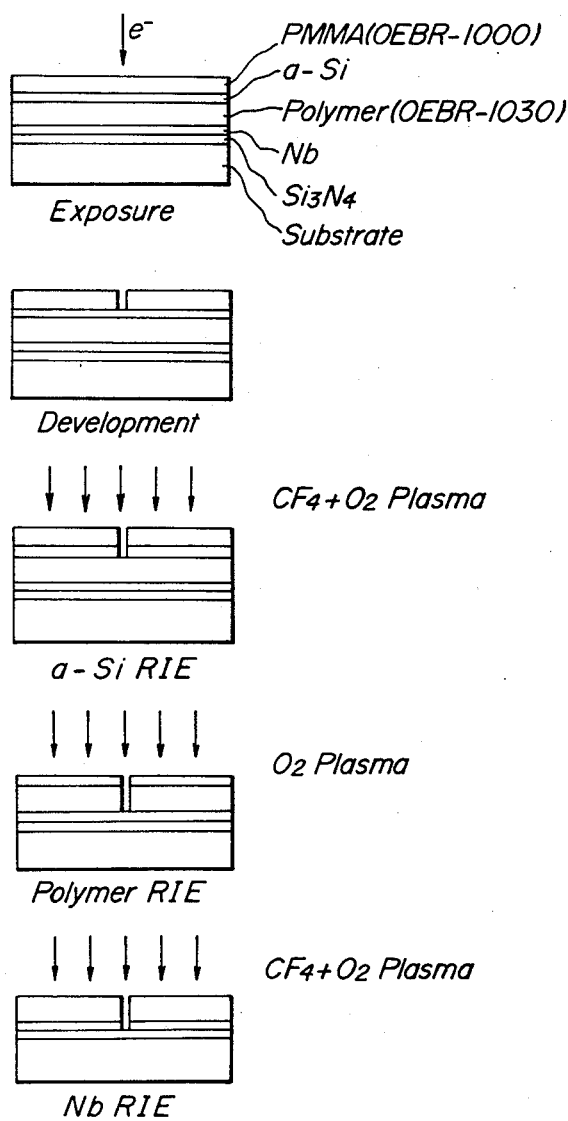

FIG_2
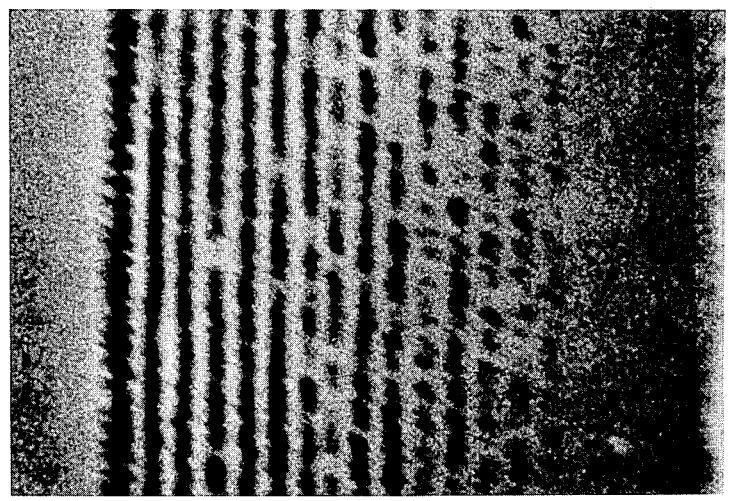
1μm
FIG_3
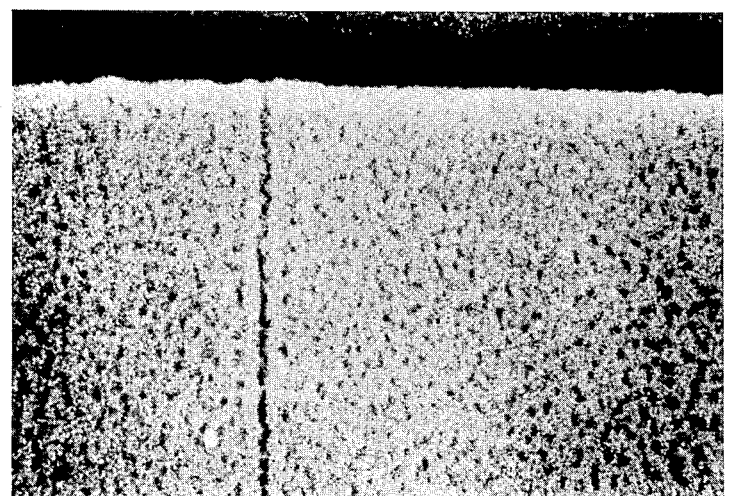
1μm

FIG_4
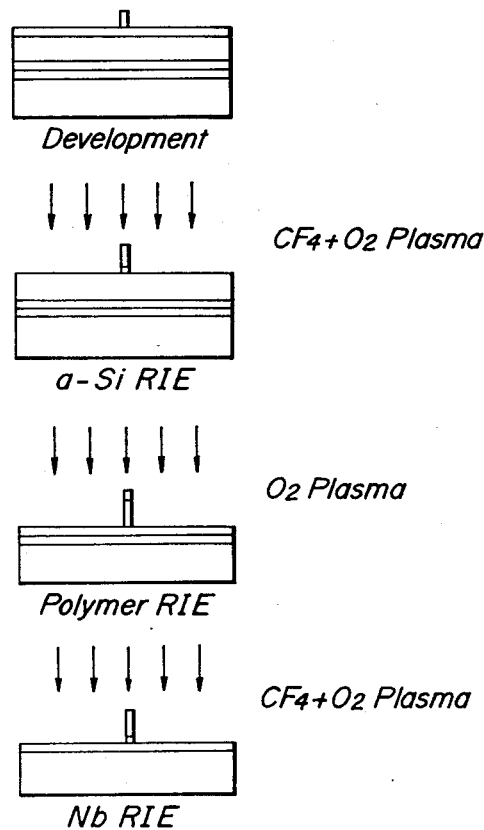

FIG_5
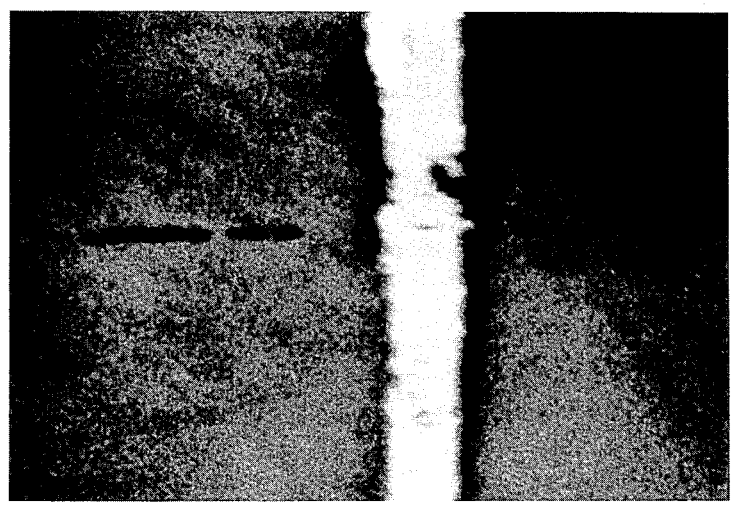
1μm

FIG_6
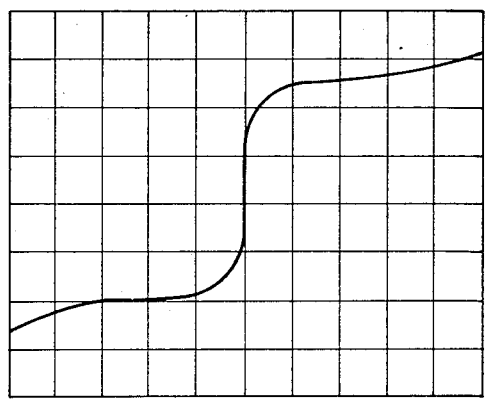
VER:50μA/div. HOR:200μV/div.
FIG_7
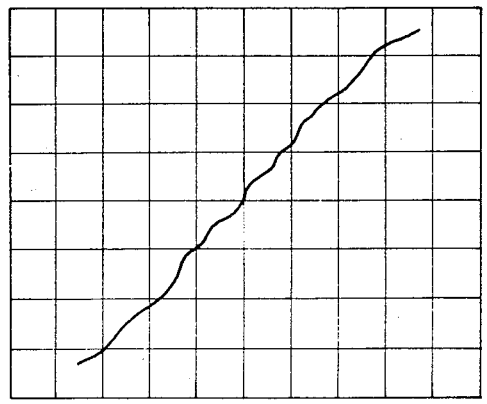
VER:50μA/div. HOR:50μV/div.

4,790,903

INTERMITTENT ETCHING PROCESS

This is a continuation of Ser. No. 07/017,397, filed on Feb. 24, 1987 now abandoned.

BACKGROUND OF THE INVENTION

1. Field of the Invention

The present invention relates to an etching process for minutely etch-machining layers deposited upon a substrate, particularly to an etching process which enables reactive ion etching suitable for the minute etch-machining to be effected efficiently with an increased etch rate.

2. Description of the Prior Art

With the minimization in size of functional devices in accordance with the recent advance of processing techniques, the necessity of forming recesses of the order of submicron in layers of semiconductors, etc. has been increasing. Particularly, it is often indispensable in fabrication of functional devices, such as Josephson devices or the like, to etch extremely minute grooves of about 0.1 $\mu$m in width.

When a recess or groove with such a minute size is being formed, it is required that an aspect ratio, i.e., the ratio of the depth to the width of the recess, be as large as possible, while the side wall of the recess be made as vertically as possible. However, even in the case where such minute recesses are formed by making use of a reactive ion etching (RIE) process which generally effects an anisotropical etching wherein the etch rate in the normal direction is appreciably larger than that in the lateral direction, a difficulty is encountered such that the etch rate is extremely low as compared with that in etching of recesses having a broader opening area. As a cause for this, it is considered that the smaller the width of the recess and the larger the aspect ratio, the more difficult will it be for gaseous reaction products produced by etching to move out of the recess, which interfere with the progress of etching.

Further, in RIE, since the etching is effected anisotropically by means of positively charged ions which have been accelerated by direct voltage (self-bias voltage) between electrodes and are incident perpendicularly upon the layer, it is necessary to increase the self-bias voltage in order to augment the etching anisotropy. However, in RIE, the increase of the self-bias voltage requires an increase of the radiofrequency power which is accompanied with a substrate temperature elevation. Organic resists to be used as a masking material against etching are usually deteriorated at considerably elevated temperatures, so that in the case where a long time etching is required for deepening the recess, the self-bias voltage cannot be so much increased in order to suppress the temperature elevation, and a sufficiently augmented etching anisotropy is, therefore, not achievable.

SUMMARY OF THE INVENTION

An object of the present invention is, solving such problems the prior art is involved in, to provide an etching process which enables the formation of recesses having an extremely small opening width, effectively with a large aspect ratio.

The above object can be achieved by the present invention that is an intermittent etching process for forming a recess having a minute opening with a large aspect ratio in a layer, which comprises RIE steps of brief duration alternating with vacuumizing for evacuating gaseous reaction products to prevent a gaseous pressure increase of the recess, so as to facilitate the subsequent RIE step. Namely, the etching step of brief duration, preferably about 20–60 seconds, most preferably about 30 seconds, is repeated intermittently and in the intervals, gaseous reaction products produced in the recess by the etching are forcibly removed out of the recess by means of vacuumizing preferably for about 1–3 minutes, most preferably for about 2 minutes, whereby a gaseous pressure increase in the recess is prevented. Extremely narrow recesses or grooves with a desired depth can be readily obtained by intermittent repetition of the RIE step several times. Thus, according to the process of the invention, etching can progress without hindrance, otherwise caused by gaseous pressure increase in the recess. Further, since the duration of a single etching step is relatively short, the substrate temperature elevation by the gaseous discharge during the etching step can be minimized and, moreover, the substrate temperature can be lowered during the vacuumization which allows radiofrequency voltage in RIE to increase and accordingly the self-bias voltage can increase as well, so that the etching anisotropy is augmented.

BRIEF DESCRIPTION OF THE DRAWING

FIG. 1 is a diagram of an embodiment of the process according to the present invention;

FIG. 2 and FIG. 3 are respectively SEM photomicrographs of etched lines in Nb according to the process of the present invention;

FIG. 4 is a diagram of processing sequence of wiring patterning;

FIG. 5 is a SEM photomicrograph of weak-link region of bridge fabricated according to the process of the invention; and FIG. 6 and FIG. 7 are respectively diagrams of I-V characteristics of a Josephson device fabricated according to the process of the invention.

DETAILED DESCRIPTION OF THE INVENTION

The present invention will be explained in more detail by way of examples with reference to the attached drawing.

At the outset, explanation will be briefly made of a manufacturing process and its results in etch-machining of a minute groove in a niobium (Nb) layer constituting the aforementioned Josephson devices, by using the intermittent etching process of the present invention.

In order to form a minute groove with desired pattern and size in the Nb layer by means of RIE, three resist layers were successively deposited on the Nb layer and then partly removed upon exposure to electron beams to leave a mask with a negative pattern. The reason why three resist layer technique was employed was to reduce as much as possible a proximity effect induced by electron scattering in the resist and backscattering from the Nb layer during the exposure to electron beams, and to make the effective region of the electron beam exposure as small as possible. The bottom layer of an organic resist was required to be about 0.3–0.6 $\mu$m thick the necessity of providing a sufficient thickness as a mask against etching a material having a relatively small etch rate, such as Nb. Therefore, when a groove having an about 0.1 $\mu$m opening width was etched which would be adaptable to ultraspeed Josephson devices, an aspect ratio of at largest about 6 was obtained. On the organic resist layer and the Nb layer, etching in accordance with the intermittent etching process of the invention was effected and a groove having an opening about 0.1 μm wide was readily formed.

When the Nb layer was subjected to the intermittent RIE, the duration of the gaseous discharge by application of radiofrequency field in the single RIE step was 30 seconds. After the electric discharge had been stopped, only vacuum drawing still remained as continued for 2 minutes and then the electric discharge was resumed. The RIE step was repeated 3 times in such an alternating process and the desired aspect ratio was obtained. The etch rate of the Nb layer in this case was considerably larger than that in the conventional continuous RIE process, and it was demonstrated that the intermittent etching process according to the present invention is very effective for etch-machining a minute groove of small width with a large aspect ratio.

The above example of the present invention will be further explained in more detail hereinafter.

Bridge type Josephson devices are small in size so that its device capacity may be negligible, which are suitable for application to high-speed digital arithmetical device and have a plane structure suitable for integration. However, in order to obtain a bridging connection of favorable characteristics, it is necessary to machine and form a minute groove having a width of about several times the coherence length of the material, namely, about 0.1 μm, in the weak-link region.

As a process suitable for such a minute machining, those which can fabricate the device on an insulator substrate are required, to enable high density integration to be realized and a superconducting ground plate to be employed. From the foregoing points of view, the inventors vapor-deposited, only once, Nb as the weak-link region on an insulator substrate, machined to form a groove of about 0.1 μm in width by using an electron beam lithography technique and thus fabricated a varable thickness type Josephson device as will be described below.

As a process for machining a groove of about 0.1 μm in width, there have been known an oblique vapor deposition method, lift-off method, etc. Since these were, however, not adaptable to machining of Nb i.e. a superconducting metal having a high melting point temperature, the desired minute machining was effected by means of RIE, by making use of a resist mask that was formed on the Nb layer deposited upon an insulator substrate and that was delineated with a pattern by electron beam exposure.

The electron beam exposing apparatus (JEOL Model JBX-5DS) employed in fabrication of the mask against RIE, has an electron beam acceleration voltage of 25 KV and can narrow the electron beam diameter down to 10 nm, while the machinable smallest width of the groove is limited by a proximity effect of electron beam based upon:

(a) electron backscattering from the material being etched, and
(b) electron scattering in the resist.

Therefore, for the minute machining by making use of electron beam exposure, the proximity effect must be reduced. In order to reduce the abovementioned (a) electron backscattering from the material being etched, it is conceivable to make the layer to be etched extremely thin, nevertheless, the Nb layer constituting a Josephson device cannot be thinned from the necessity of making the thickness at least 0.1 μm, and also reduction of the aforementioned (b) electron scattering in the resist might be achievable, under the condition of constant electron beam acceleration voltage, by making the resist layer as thin as possible, and in fact, it is necessary for the resist layer to be provided with a sufficient plasma-resistivity as a mask to be employed in RIE in Nb membrane of at least 0.1 μm in thickness. Resists for electron beams generally exhibit a large etch rate for RIE, and particularly a PMMA resist most excellent in resolving power, which is used to obtain a high resolution of about 0.1 μm, exhibits an extremely large etch rate such as 300-400 nm/min., which is therefore required to be considerably thick as a mask upon the Nb layer to be subjected to RIE, so that the aforementioned (b) electron scattering in the resist is inevitable.

In an embodiment of the etching process of the present invention wherein a groove of 0.1 μm in width was machined by means of RIE in an Nb layer for Josephson devices, a manufacturing process by making use of a three layered resist as shown in FIG. 1 was employed.

In the three layered resist shown in FIG. 1, since an organic polymer membrane i.e. the bottom layer is used as a mask on the Nb layer to be subjected to RIE, the PMMA resist membrane i.e. the top layer to be exposed to electron beams can be made very thin, so that, if such a three layered resist is employed, (a) electron backscattering from the material being etched can be reduced by making the organic polymer bottom layer sufficiently thick, while (b) electron scattering in the resist can also be reduced by making the PMMA resist top layer sufficiently thin.

Further, for the resist of the top layer, an electron beam resisting PMMA (OEBR-1000) most excellent in resolving power is employed and, on the other hand, for the organic polymer resist of the bottom layer, the following three conditions are required:

(1) a sufficient plasma-resistivity be provided as a mask on an Nb layer to be subjected to RIE,
(2) the resolving power be sufficiently large when subjected to RIE by $O_2$ plasma, and
(3) exfoliation be easily done.

With respect to the plasma resistivity, photoresists are generally superior to electron beam resists and, in contrast, with respect to the resolving power, electron beam resists are much superior. The organic polymer resist, OEBR-1030, of the bottom layer, a positive type electron beam resist, is excellent in plasma-resistivity and also excellent in resolving power as compared with, for example, the photoresist, MP-1400J, so that it can be minutely machined by means of RIE.

Besides, as described above, in the three layered resist, the top resist membrane was made as thin as possible for electron beam exposure and, at the same time, each membrane was also made as thin as possible in the extent that it served effectively as a mask for the lower membrane to be subjected to RIE. The thickness of such membranes are shown in Table 1 below.

TABLE 1

|  | Resist layer | Thickness |
|---|---|---|
| Top layer: | OEBR (diluted with trichloroethylene) | ~200 nm |
| Middle layer: | Amorphous silicon (doped with P) | ~40 nm |
| Bottom layer: | OEBR-1030 | ~600 nm |

The amorphous silicon (a-Si) was deposited by means of plasma CVD, in a P-doped condition so as to prevent electrification. As conditions for the deposition, a deposition temperature of 150° C. and a discharge power of 10 W were selected so that the organic resist bottom layer might not be damaged during deposition. As the middle layer, an a-Si was used, because of its readily attainable low resistance to prevent electrification, facility of RIE, and feasibility of deposition without damaging the organic resist bottom layer. The dose amount in electron beam exposure was 1 nC/cm. As a developer, the solution of MIBK:IPA=1:3 was used.

In the processing sequence shown in FIG. 1, RIE conditions respectively of a-Si, organic resist (OEBR-1030) and Nb membranes are given in Tables 2, 3 and 4.

TABLE 2

| RIE condition of a-Si | |
|---|---|
| Gas | $CF_4 + O_2$ |
| RF power | 250 W |
| Gas pressure | 3 Pa |
| Gas flow rate | 30 sccm |
| Self-bias voltage | 800 V |
| Etch rate: | |
| a-Si | −100 nm/min. |
| OEBR-1000 | −300 nm/min. |

TABLE 3

| RIE condition of polymer | |
|---|---|
| Gas | $O_2$ |
| RF power | 200 W |
| Gas pressure | 3 Pa |
| Gas flow rate | 30 sccm |
| Self-bias voltage | 700 V |
| Etch rate: | |
| a-Si | <10 nm/min. |
| OEBR-1030 | −200 nm/min. |

TABLE 4

| RIE condition of Nb | |
|---|---|
| Gas | $CF_4 + O_2$ |
| RF power | 250 W |
| Gas pressure | 3 Pa |
| Gas flow rate | 30 sccm |
| Self-bias voltage | 800 V |
| Etch rate: | |
| Nb | −80 nm/min. |
| OEBR-1030 | <200 nm/min. |

In each of these conditions, the admitting gas pressure was made as low as possible and the self-bias voltage was raised as high as possible, so as to etch a minute pattern. Further, each of these Tables shows the etch rate in the case where a recess having a large opening area is etched. As already explained hereinbefore, when a minute pattern such as a fine groove is etched, the smaller the width of the groove and the larger the aspect ratio, the more difficult are etching reaction products (e.g. $CO_2$, $H_2O$, etc. resulting from etching of an organic resist, OEBR-1030) to be removed out of the groove, which interfere with the progressing of the etching, and so an actual etch rate is much smaller than those shown in the Tables.

Now, in FIG. 1, a silicon nitride ($Si_3N_4$) layer and a niobium (Nb) layer are successively deposited on a substrate and then on the Nb layer, a three layered resist consisting of PMMA (OEBR-1000), a-Si and a polymer (OEBR-1030) is deposited. Then, electron beam exposure and development are carried out to form a removed portion with an opening of the desired shape and size in the top layer, followed successively by RIE by making use of $CF_4+O_2$ gas plasma to form a removed portion with an opening of the identical shape in the middle resist (a-Si), removal of the top resist, further RIE by making use of $O_2$ gas plasma to form a removed portion with an opening of the identical shape in the polymer resist bottom layer, removal of the middle resist (a-Si), and the final RIE by making use of $CF_4+O_2$ gas plasma to form a removed portion with an opening of the desired shape and size.

In order to solve such a problem as described before that the lowering of etch rate arises in the formation by means of RIE of a recess having a minute opening with a large aspect ratio, gaseous reaction products are forcibly evacuated which have been produced during etching of, for example, the polymer resist (OEBR-1030) and Nb layers to be formed with a recessed portion, in the manufacturing process shown in FIG. 1. According to the process of the present invention, such etching is carried out intermittently, by alternating gaseous discharge steps in RIE with vacuumizing to maintain a pressure of about $3 \times 10^{-3}$ Pa in a hermetic reaction vessel to thereby evacuate the gaseous reaction products from the etched recess.

Such intermittent etching has an effect such that a radiofrequency power to be applied to discharge and accordingly self-bias voltage as well can be increased equivalently with suppression of temperature elevation in RIE, preventing deterioration of the resist at high temperatures.

In FIGS. 2 and 3 are shown SEM photomicrographs of minute patterns etched in an Nb layer according to the above-described etching process of the present invention. The minute lines shown in FIG. 2 were etched with dose amounts reduced successively from the left to the right, by 10% for every line, which demonstrate feasibility of machining of a recess having an opening about 0.1 μm wide in Nb layer.

Since the present invention has the final object to manufacture a logic circuit by using bridge-type Josephson devices with a process suitable for high density integration, the minimum width of the line is decided to be 1 μm so that the occupied area per one gate can be made as small as possible. Accordingly, the electrode wiring patterning of the bridge-type Josephson devices is also performed by electron beam exposure, so as to improve the superposition accuracy in fabrication of logic circuits.

As described above, electron beam resists are generally poor in plasma resistivity and, in particular, the negative type resist, PGMA (OEBR-100) has an extremely large etch rate for RIE, so that a manufacturing process by making use of three layered resist, as shown in FIG. 4, is adopted also in the case of fabrication of Josephson devices. In the three layered resist shown in FIG. 4, MP-1400J is used as the organic resist of the bottom layer, because of its excellency with respect to plasma resistivity and less necessity of resolving power itself, different from the manufacturing process shown in FIG. 1. Since the PGMA resist has a low baking temperature, the MP-1400J resist will not be deteriorated during fabrication of the three layered resist. MP-1400J has been diluted with a thinner so that the thickness of the membrane can be 600 μm. Similarly to the manufacturing process shown in FIG. 1, the a-Si is deposited by means of plasma CVD wherein the deposition temperature is 100° C., because the baking temperature of 1400J is as low as 130° C. Further, in the manufacturing process shown in FIG. 4, the same gas as that in the manufacturing process shown in FIG. 1 is employed, and the gas pressure is increased to 5 Pa so that organic substances may hardly deposit during etching, while the radiofrequency power to discharge and accordingly self-bias voltage as well are decreased, mainly in order to minimize temperature elevation during RIE.

A process for fabricating bridge-type Josephson devices by making use of the etching process of the invention will be briefly described as follows.

(1) Silicon nitride ($Si_3N_4$) membrane 100 nm thick is deposited on a silicon substrate by means of plasma CVD,
(2) niobium (Nb) membrane 120 nm thick is deposited by means of electron beam VD,
(3) patterning for electrodes and bonding pads of the device is performed in accordance with the manufacturing process shown in FIG. 4, and
(4) patterning for bridging portions is performed in accordance with the manufacturing process shown in FIG. 1.

Since bridge-type Josephson devices can be fabricated through only one Nb VD step, the above process is suitable for integration.

A SEM photomicrograph of a bridge-type Josephson device fabricated by the above-described process is shown in FIG. 5. Bridge lengths of 0.1–0.15 μm have been obtained with a good reproducibility.

FIG. 6 shows an example of current-voltage (I-V) characteristics at 4.2° K. of a bridge-type Josephson device fabricated by the above-described process. Hitherto obtained variable thickness bridge (VTB) elements have critical current (Ic) values ranging from 0.05 to 0.5 mA and IcRn products ranging from 0.05 to 0.3 mV. Further, an example of I-V characteristics with microwave irradiation at about 10 GHz is shown in FIG. 7. The characteristic curve in FIG. 7 shows steps appeared up to about 0.1 mV. Furthermore, what is considered to affect significantly characteristics of devices, when VTB elements are fabricated by the above-mentioned process, is the thickness of Nb membrane at bridging portions and damages by RIE. However, when the opening width of grooves is no more than 0.1 μm, the thickness of Nb membrane remaining at bridging portions is difficult to determine from the observation by SEM of cross-sectional configurations, yet it is presumed to be several hundred Å and the variation in characteristics of the elements is considered to be due to an insufficient control of the thickness of the membrane.

The condition for RIE of Nb was determined to increase considerably the self-bias voltage so that a minute pattern could be etched. In this case, it was considered that an appreciable physical sputtering was concurrently performed, so that the self-bias voltage was varied in the range between 800 and 700 V. Within this range, no significant difference showed up in characteristics of the elements.

The thickness of Nb membranes depends upon etching conditions. Difficult as it is to figure out influences exerted upon only by the etching conditions, it is conceivable that a decrease of the self-bias voltage will enable damages by RIE to decrease and characteristics of elements to improve.

As is apparent from the foregoing explanation, the present invention has a particular, prominent effect such that, when a deep recess with a minute opening, such as a bridging portion of Nb, etc. constituting Josephson devices, is machined by RIE, whereas the etch rate has heretofore been very low as compared with etching of a recess with a broad opening, a large improvement in etch rate can be achieved and minute elements with excellent characteristics can be readily fabricated.

While there has been shown and described the preferred embodiments of the present invention, it will be obvious to those skilled in the art that various alterations and modifications thereof can be made without departing from the scope of the invention as defined by the following claims.

What is claimed is:

1. A process for forming a recess having a minute opening of a desired pattern with a width of about 0.1–0.15 μm and a large aspect ratio in a niobium layer by means of reactive ion etching (RIE), comprising the steps of:
   (a) forming a workpiece provided with the niobium layer covered by a three layered resist consisting of polymethylmethacrylate (PMMA) top layer, an amorphous silicon (a-Si) middle layer and an organic positive type electron beam resist (OEBM) bottom layer;
   (b) subjecting said workpiece to electron beam exposure to form a removed portion with said desired pattern in the top layer; and
   (c) subjecting the workpiece to intermittent RIE alternating with vacuumizing for evacuating gaseous reaction products to prevent a gaseous pressure increase in an etched recess, by making successive use of $CF_4$ plus $O_2$ gas plasma, $O_2$ gas plasma and $CF_4$ plus $O_2$ gas plasma, to form a recess having an opening with said desired pattern stepwise through the middle layer, bottom layer and niobium layer.

2. A process as claimed in claim 1 wherein the duration of a single reactive ion etching step is about 20–60 seconds and a vacuumizing step is for about 1–3 minutes.

3. A process as claimed in claim 1, wherein said bottom layer has a thickness of about 0.3–0.6 μm.

4. A process as claimed in claim 1, wherein said a-Si layer is doped with phosphor and has a thickness of about 40 nm or less.

5. A process as claimed in claim 1, wherein said top layer is diluted with trichloroethylene and has a thickness of 0.2 μm or less.

6. A process as claimed in claim 1, wherein said RIE is carried out with a self-bias voltage of at least 700 V.

* * * * *